US006842054B2

United States Patent
Wang (10) Patent No.: US 6,842,054 B2
(45) Date of Patent: Jan. 11, 2005

(54) FREQUENCY DIVIDER WITH REDUCED JITTER AND APPARATUS BASED THEREON

(75) Inventor: Zhenhua Wang, Zuerich (CH)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/477,983

(22) PCT Filed: May 17, 2002

(86) PCT No.: PCT/IB02/01745
§ 371 (c)(1),
(2), (4) Date: Nov. 17, 2003

(87) PCT Pub. No.: WO02/093747
PCT Pub. Date: Nov. 21, 2002

(65) Prior Publication Data
US 2004/0140831 A1 Jul. 22, 2004

(30) Foreign Application Priority Data
May 17, 2001 (EP) .............................. 01112125

(51) Int. Cl.[7] .............................................. H03K 21/00
(52) U.S. Cl. ........................... 327/115; 327/117; 377/47
(58) Field of Search ................................ 327/115, 117; 377/48–52, 47, 110; 708/101, 103

(56) References Cited

U.S. PATENT DOCUMENTS

| 4,184,068 | A | * | 1/1980 | Washburn | 377/44 |
| 4,264,863 | A | * | 4/1981 | Kojima | 377/110 |
| 5,065,415 | A | * | 11/1991 | Yamashita | 377/52 |
| 5,195,111 | A | * | 3/1993 | Adachi et al. | 377/52 |
| 5,982,840 | A | * | 11/1999 | Aisaka | 377/2 |
| 6,066,990 | A | * | 5/2000 | Genest | 331/25 |
| 6,593,782 | B2 | * | 7/2003 | Pierschel et al. | 327/115 |

* cited by examiner

Primary Examiner—Minh Nguyen
(74) Attorney, Agent, or Firm—Peter Zawilski (57) ABSTRACT

A circuit generates an output signal whose frequency is lower than the frequency of an input signal. In an example embodiment, there is a chain of frequency dividing cells. Each of the frequency dividing cells has a pre-defined division ratio and a clock input for receiving an input clock, a divided clock output for providing an output clock to a subsequent frequency dividing cell, a mode control input for receiving a mode control input signal from the subsequent frequency dividing cell, and a mode control output for providing a mode control output signal to a preceding frequency dividing cell. Further included are a latch for altering the division ratio of each of the frequency dividing cells and D-Flip-Flop circuitry having two latches. A first signal clocks the first latch and a second signal clocks the second latch, whereby the frequency of the first signal is lower than the frequency of the second signal.

11 Claims, 8 Drawing Sheets

*Replacement Sheet*

FREQUENCY DIVIDER WITH REDUCED JITTER AND APPARATUS BASED THEREON

FIELD OF THE INVENTION

The present invention concerns frequency dividers and apparatus for frequency division. More particularly, this invention relates to a frequency divider architecture and circuit technique based on the zipper divider architecture being well suited for use in transmitters and receivers, in particular for radio frequency signal transmission.

BACKGROUND OF THE INVENTION

Great efforts have been made in radio frequency (RF) design towards one-chip transceivers in standard complementary metal oxide semiconductor (CMOS) in recent years. Particularly the CMOS implementation of frequency dividers and frequency synthesizers—one of the key building blocks in a transceiver—have attracted a lot of attention. The most notable trend here is the zipper divider architecture and the so-called current-mode logic (CML).

Figure 1:
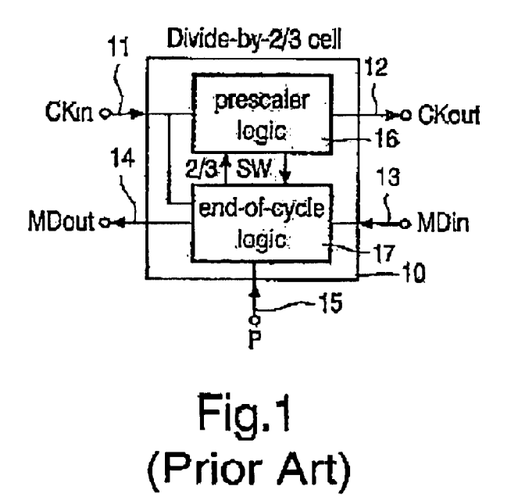
FIG. 1 is a conventional divide by $2/3$ cell comprising two logic blocks.

The known zipper divider is comprised of a chain of divide-by-⅔ cells of identical circuitry. Shown in FIG. 1 is a conventional divide-by-⅔ cell 10 having five terminals 11–15: clock input (CKin) 11, divided clock output (CKout) 12, mode control input (MDin) 13, mode control output (MDout) 14, and a programming input (P) 15. Each divide-by-⅔ cell 10 consists of two circuit blocks: a prescaler logic block 16 which divides either by 2 or 3, controlled by a swallow signal (SW) generated by another block called end-of-cycle logic 17. When a programming bit P=0 (with MDin=1 or MDin=0) is applied at the programming input 15, then the cell 10 divides by 2 and when P=1 and MDin=1 it divides by 3.

The divide-by-⅔ cells are typically implemented in CML. An elementary CML logic circuit comprises several stacked differential pairs, two resistive or active loads, and one tail current source. Further details concerning CML implemented zipper dividers is described by C. Vaucher and Z. Wang in "A low-power truly-modular 1.8 GHz programmable divider in standard CMOS technology", ESSCIRC'99. pp.406–409, 1999, and by C. Vaucher, I. Ferencic, M. Locher, S. Sedvallson, U. Voegeli, and Z. Wang in "A family of low-power truly modular programmable dividers in standard 0.35-mm CMOS technology", SC-35, No. 7, pp.1039–1045, 2000.

Figure 2A:
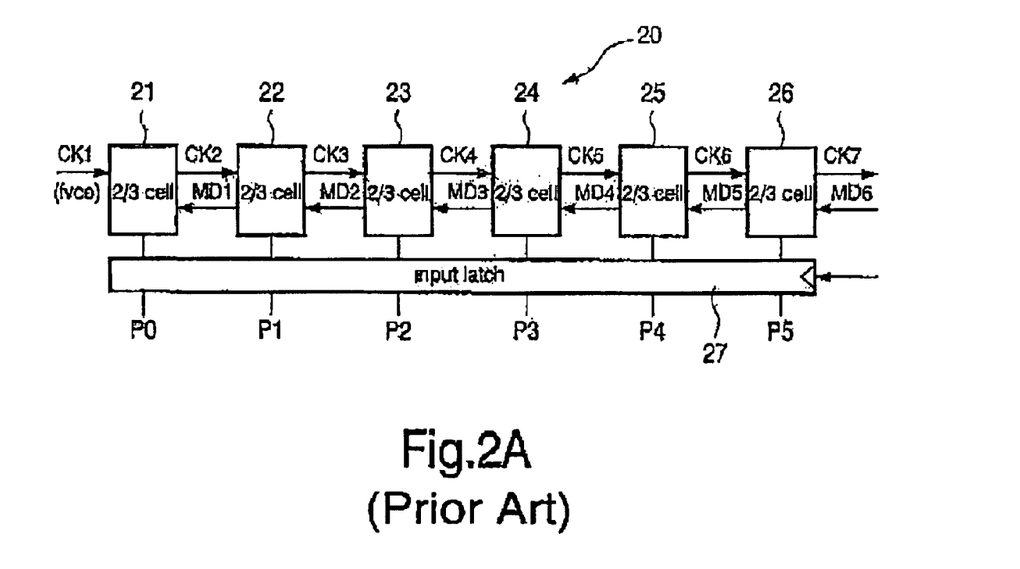
FIG. 2A is a conventional zipper divider architecture comprising six divide by $2/3$ cells.
Figure 2B:
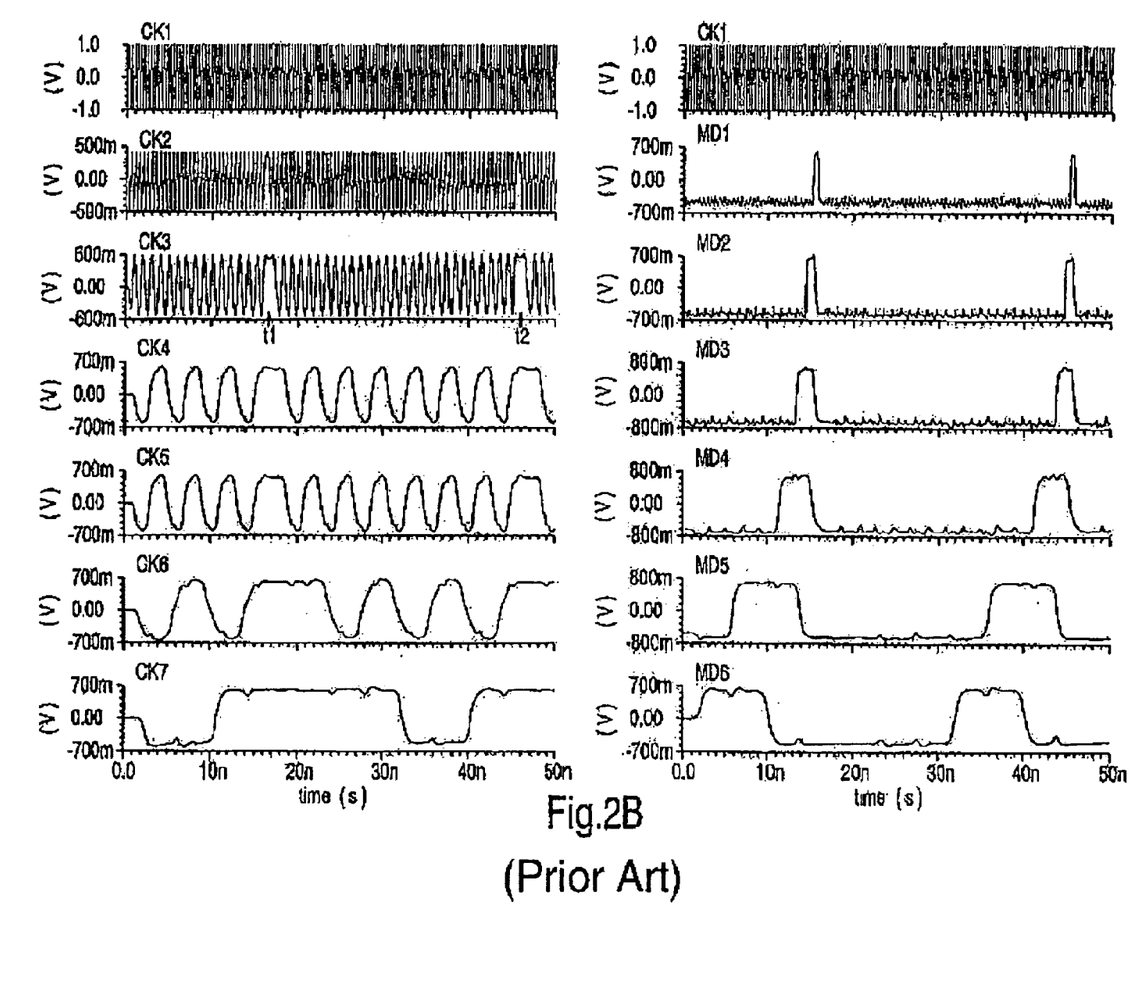
FIG. 2B is a diagram depicting the clock signals and mode control signals of the conventional zipper divider architecture of FIG. 2A.

An example of a known frequency divider 20 comprising a chain of six divide-by-⅔ cells 21–26 and an input latch 27 is depicted in FIG. 2A. The divider 20 is capable of operating at an input clock frequency (CK1) in the GHz range. FIG. 2B shows the terminal signals of the frequency divider 20. The clock input and clock output signals (CK1–CK7) are depicted in the plots on the left hand side of FIG. 2B and the mode control signals (MD1–MD6) are depicted on the right hand side together with CK1. The amplitudes of the clock input and clock output signals (CK1-CK7) range in the present example between –500 mV and +500 mV (peak-to-peak) since the divider 20 is realized in CML. In the present example, for most of the time, the cells 21–26 divide their respective clock input by 2. If the division ratio is 3, the pulse width is wider, as visible on the left hand side of FIG. 2B. In case of the signal CK3, for example, at the times t1 and t2 the division ratio is 3. This is due to the fact that a binary word P=111111 is applied to the programming inputs (P0–P5) of the input latch 27. If the programming inputs are always logic "1" the division ratio of the individual cells 21–26 is only determined by the mode control signal (MD) issued by a subsequent cell to a preceding cell.

The major effort in the telecommunications IC industries is to constantly improve the quality and to reduce the manufacturing costs. Along with the evolution from the second generation such as GSM to the third generation UMTS, new innovative techniques and technologies are vital in this fiercely competitive market. One of the new techniques is the so-called fractional-N PLL transmitter, where a PLL is employed not only for the generation of carrier frequencies but also for the modulation of the signals to be transmitted. The benefits of this approach include a comparatively spurious free output spectrum with very low levels of phase noise close to the carrier, and considerable reduction of the manufacturing costs.

One of the key components in this PLL transmitter is the frequency divider. The recent trend of its CMOS implementation is to exploit the above-mentioned zipper divider architecture in combination with CML. Two key performance parameters of the divider are power consumption and the output spectrum purity.

For low-power applications, a divider architecture capable of reducing the power consumption by up to 50% has been proposed in the co-pending patent application entitled "IMPROVED FREQUENCY DIVIDER WITH REDUCED POWER CONSUMPTION, APPARATUS BASED THEREON, AND METHOD FOR POWER EFFICIENT FREQUENCY DIVISION". This co-pending patent application was filed on Dec. 22, 2000 is currently assigned to the assignee of the present patent application. Application number 00128322.5 was assigned.

Figure 3:
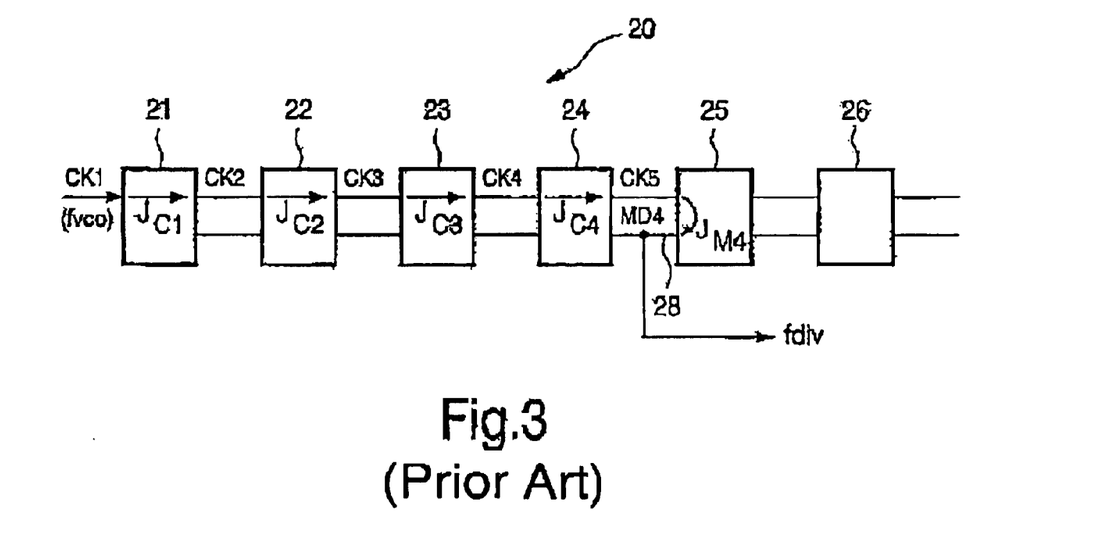
FIG. 3 is a schematic representation of a conventional zipper divider architecture used to illustrated the jitter accumulation.

While the phase noise is used to describe the spectrum purity in the frequency domain, jitter is used as a measure for the same thing in the time domain. Jitter results from circuit noises that change the transition of signals across the threshold. Jitters are present in every cell of the zipper divider 20 of FIG. 2A. Due to the asynchronous nature of this kind of divider 20, jitters accumulate along the signal path from the left to the right of the chain. This effect is called jitter accumulation. If the signal MD4 is taken as the output 28 (cf. FIG. 3), for example, all jitters along the path accumulate to $$J_{OUT}^2 = J_{IN}^2 + J_{C1}^2 + J_{C2}^2 + J_{C3}^2 + J_{C4}^2 + J_{M4}^2$$

where $J_{IN}$ is the standard deviation of the jitter associated with the input CK1, $J_{Ci}$ the standard deviation of the jitter added to its output CK(i+1) by cell i, and $J_{M4}$ the jitter deviation added to MD4 by the cell 25, as depicted in FIG. 3. Because the current consumption is scaled down in the zipper divider 20 and at the same time the resistive load is scaled up with the frequency cell by cell, jitters added by one cell are larger than those added by its preceding cell.

Jitter is a major concern in frequency dividers, oscillators, frequency synthesizers, etc. because introducing even a small jitter into these circuits leads to dramatic changes in its frequency spectrum and timing properties, thus resulting in lower signal-to-noise ratio, increased bit error rates, and higher interference to neighboring channels. Jitter is also important in clocked and sampled-data systems because the zero-crossing often contain information so any uncertainties in switching instants will cause error.

Until now, the spectrum purity in general and jitter accumulation in particular is not seriously considered when designing zipper divider circuitry in CML.

It is thus an objective of the present invention to improve current divider circuitry.

It is another objective of the present invention to provide a frequency divider with reduced or eliminated jitter.

It is another objective of the present invention to provide a frequency divider with improved spectrum purity.

SUMMARY OF THE INVENTION

A novel reclocking and a novel frequency divider architecture with double-reclocking are presented herein. The novel architecture and technique is based on the known zipper divider architecture.

An apparatus, according to the present invention, is suited for generating an output signal whose frequency is lower than the frequency of an input signal. The respective apparatus comprises a chain of frequency dividing cells, wherein each of the frequency dividing cells has a pre-defined division ratio and wherein each cell comprises a clock input for receiving an input clock, a divided clock output for providing an output clock (CKout) to a subsequent frequency dividing cell, a mode control input for receiving a mode control input signal from the subsequent frequency dividing cell, and a mode control output for providing a mode control output signal to a preceding frequency dividing cell. The apparatus furthermore comprises a latch for altering the division ratio and a D-Flip-Flop with two latches. The first latch is clocked by a first signal and the second latch is clocked by a second signal, whereby the frequency of the first signal is lower than the frequency of the second signal.

Various advantageous embodiments are claimed in claims 2 through 10.

An apparatus according to the present invention is particularly well suited for use in a transmitter or receiver system, as claimed in claim 11.

The double-reclocking technique is devised to overcome the problems and guarantee reliable operation.

The frequency divider architecture provided herein allows reducing or eliminating jitters of different kinds of circuits, and in particular asynchronous circuits like the zipper divider circuits. The double-reclocking according to the present invention is a very effective and robust technique.

Other advantages of the present invention are addressed in connection with the detailed embodiments.

BRIEF DESCRIPTION OF THE DRAWINGS

For a more complete description of the present invention and for further objects and advantages thereof, reference is made to the following description, taken in conjunction with the accompanying drawings, in which.

DESCRIPTION OF PREFERRED EMBODIMENTS

For sake of simplicity, certain of the signal lines in the various Figures are shown as single ended signal lines. In reality, many of the signals are differential, meaning that there are in fact two signal lines. Other signals may be digital signals that are several bits wide.

In the following, reference is made to FIGS. 2A and 3. For low-jitter design it would be preferable to take the signal MD1 as the output. Unfortunately, due to some timing constraints the output signal (fdiv) of the divider is often tapped somewhere in the middle of the divider chain 20. For Bluetooth transceivers currently under development, for example, the divider output (fdiv) is tapped at MD4 (c.f. FIG. 3). As a result, jitters at the output (fdiv) may be too large to be accepted in most applications.

Figure 4A:
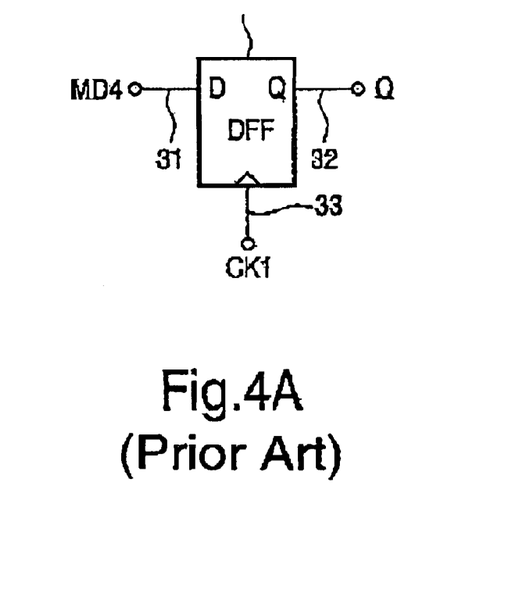
FIG. 4A is a schematic representation of a conventional DFF used for reclocking.

It turns out that the known reclocking technique fails in such devices. Reclocking is a technique used to reduce jitter. The reclocking process calls for a less jittery signal to clock a D-Flip-Flop (DFF) 30, see FIG. 4A, while the jittery signal is applied to the data input 31 of the DFF 30. Through reclocking, the jitter at a new output 32 is now reduced to that of the clock signal plus the jitter added by the DFF 30. For the zipper divider of FIG. 2A or 3, one would perform the reclocking in a way shown in FIG. 4A, where the clock CK1 applied at a clocking input 33 of the DFF 30 is considered jitter free. Unfortunately, it fails to work here because the reclocking scheme requires well defined timing relationship between the two input signals applied at 31 and 33 of the DFF 30, which is normally the case only for synchronous circuits, and some asynchronous circuits with well-controlled timing relationship.

The timing relationship between MD4 and CK1 is primarily determined by the delays of all cells 21–25 involved. The more cells involved, the larger the total delay becomes. By neglecting the effect of jitters, the delay of MD4 with respect to CK1 can be expressed as:

$$D_{OUT}=D_{C1}+D_{C2}+D_{C3}+D_{C4}+D_{M4}.$$

Figure 4B:
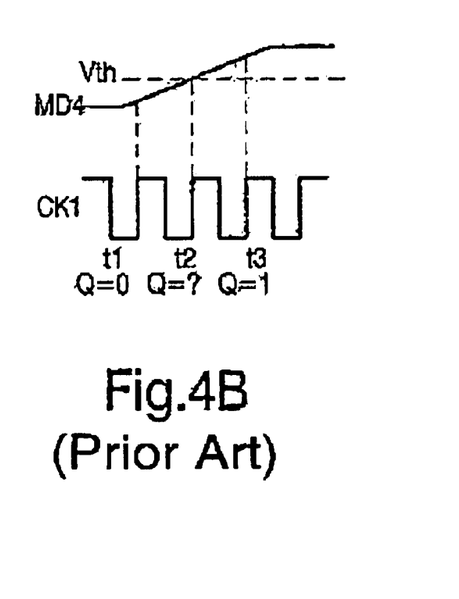
FIG. 4B shows a scenario where catastrophic errors occur.

Similarly, $$D_{C1}<D_{C2}<D_{C3}<D_{C4}$$

due to the scaling. Note that the frequency difference between CK1 and CK5 is at least as large as 16. Furthermore, signal delays are subject to many factors such as power supply, temperature, process, mismatch and so forth, making it rather difficult to bring the timing relationship between MD4 and CK1 under accurate control. A scenario shown in FIG. 4B may happen. While the Q states of the DFF 30 at time t1 and t3 are respectively logic 0 and logic 1, the output at time t2 could be either logic 0 or logic 1, depending on the momentary jitters, because the input MD4 at this moment t2 is at the threshold of the DFF 30. Even for quite small jitters, the resulting errors could be several decades greater than the jitters themselves. Therefore, this kind of error is catastrophic and must be avoided. Preliminary simulation results indicate that the probability of such a catastrophic error is as high as 7%, a value absolutely unacceptable in most applications. It turns out that neither changing to the falling edges to trigger the DFF 30 nor pre-amplifying MD4 would help in this case for the above-mentioned reasons.

Figure 5:
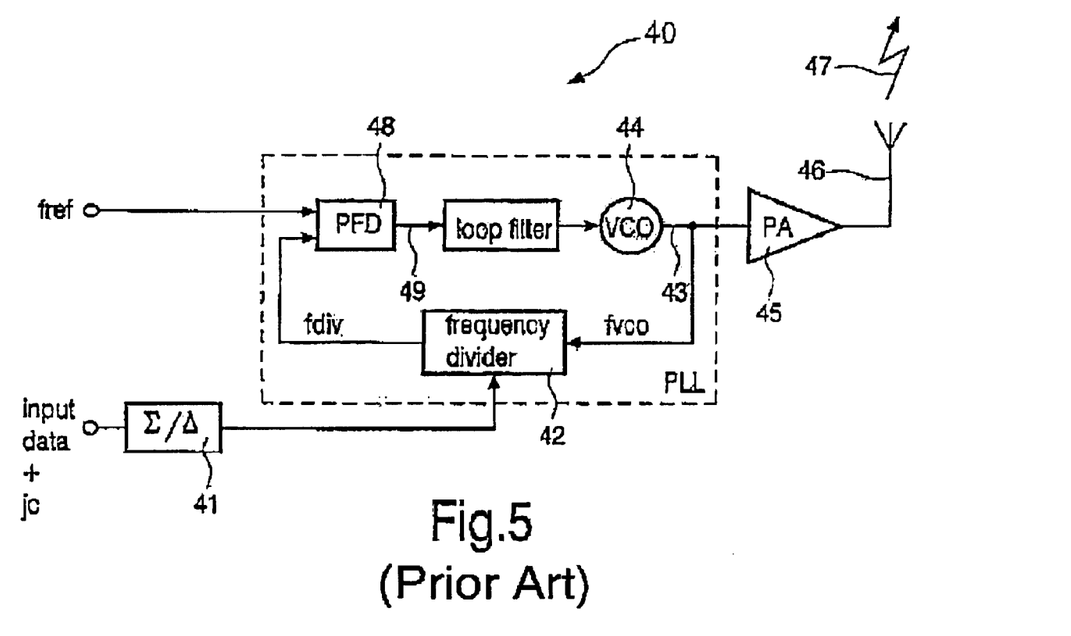
FIG. 5 is a schematic representation of a conventional fractional-N PLL transmitter.

FIG. 5 shows the basic building blocks of a conventional fractional-N PLL transmitter 40. The abbreviation PLL stands for Phase Lock Loop. The modulating data are applied via a Σ/Δ-modulator 41 to a frequency divider 42. The frequency divider allows integer division ratios, which, together with the Σ/Δ-modulator 41 (also called S/D-modulator), constitutes a fractional-N divider. In addition, the fractional-N PLL transmitter 40 comprises an input for a reference frequency (fref), a phase/frequency detector (PFD) 48 that generates an error signal at output 49 based on comparing the input signal fref and the a PLL feedback signal fdiv. The input data contain the information (input data) of both the signal to be transmitted via a communication channel 47 and the carrier frequency (fc) to control the modulus of the frequency divider 42. As a result, the output signal at the output 43 of the voltage-controlled oscillator (VCO) 44 is a modulated radio-frequency (RF) signal at the desired carrier frequency (fc). This signal is transmitted into the communication channel 47 via an amplifier (PA) 45 and an antenna 46. The VCO 44 output signal at output 43 is used to generate the PLL feedback signal fdiv.

Figure 6A:
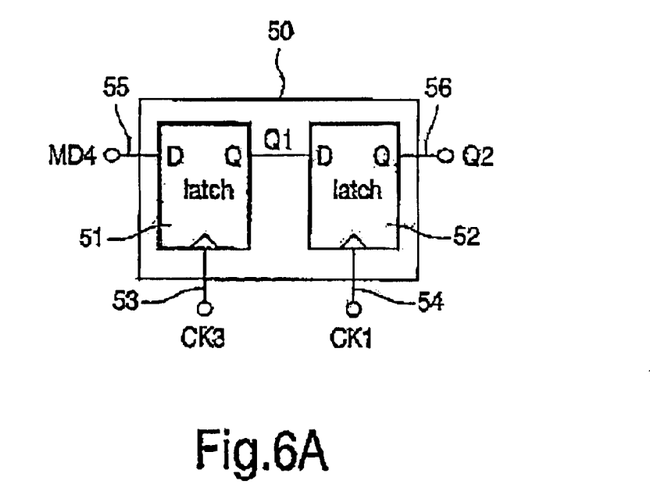
FIG. 6A is a schematic representation of a DFF employing two latches, in accordance with the present invention.

The basic principle of the present invention, herein referred to as double-reclocking technique, is being described in connection with FIGS. 6A and 6B. Double-reclocking can be accomplished with one DFF 50, as shown in FIG. 6A. This DFF comprises two D-Latches 51 and 52, equivalent to a single DFF so there is not any overhead compared to FIG. 4A. However, there is an important difference. While in FIG. 4A the DFF 30 is clocked by CK1, according to the present invention, the first latch 51 and the second latch 52 are clocked by two different signals. The first latch 51 in the present example is clocked by applying the signal CK3 to the clocking input 53, and the second latch 52 is clocked by applying the signal CK1 to the clocking input 54. Both latches 51 and 52 are triggered at the falling edges of the signals CK3 and CK1. This implementation enables frequency divider implementations that are greatly improved.

Figure 6B:
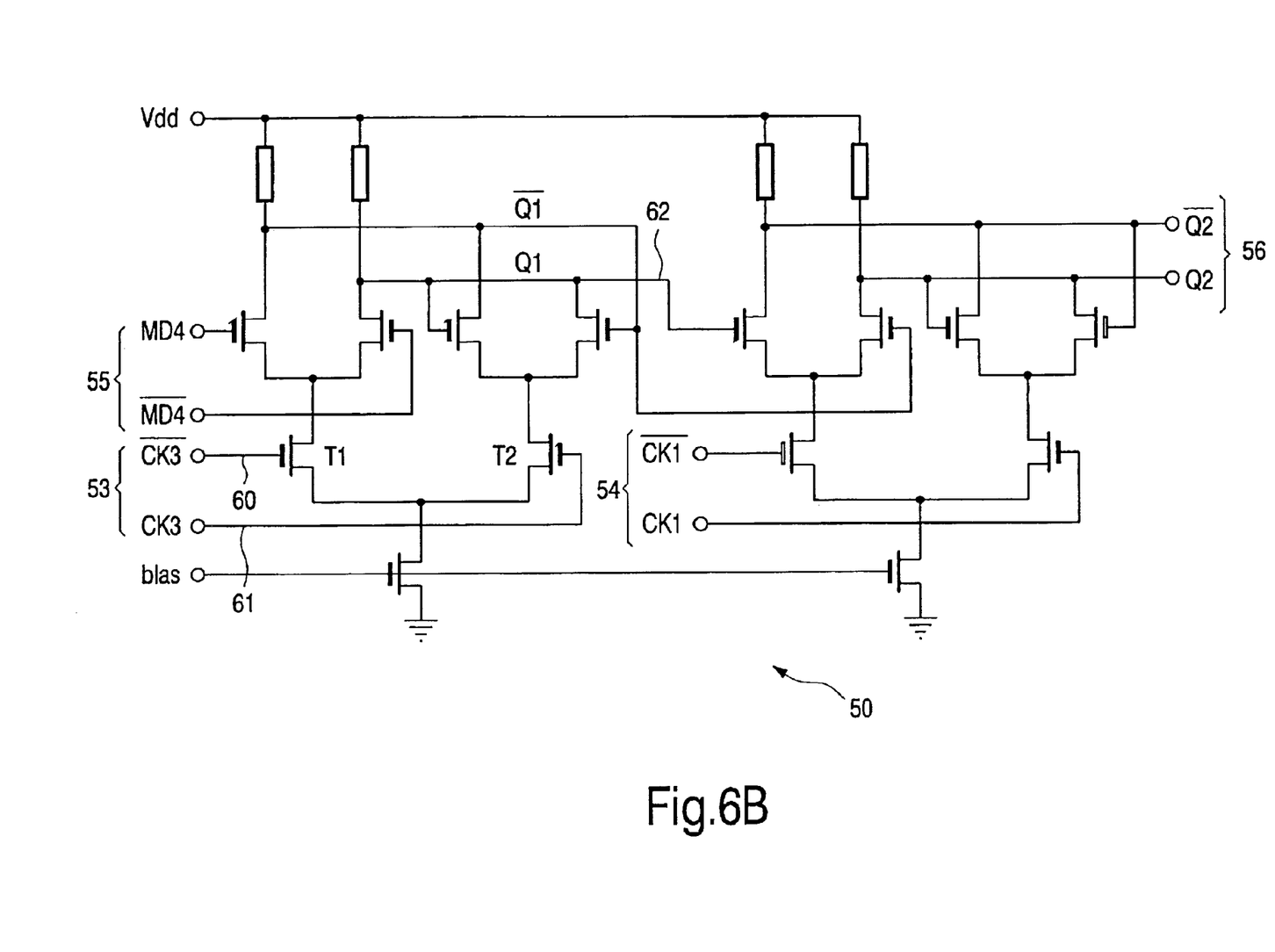
FIG. 6B is a schematic block diagram of a CMOS implementation of the DFF according to FIG. 6A.

FIG. 6B shows a CMOS implementation of the DFF 50 in CML, designed for operation at a supply voltage Vdd. As shown in FIG. 6A, two latches 51 and 52 are identified. The principle of operation is straightforward. When the signal CK3 is logic low, the MOS transistor T1, whose gate is connected to the inverted CK3 input 60 turns on, while the MOS transistor T2, whose gate is connected to the CK3 input 61 is off. So all tail current of the latch 51 flow to the left branch of the latch, and the signal at the Q1 output 62 is equal to the signal at the input 55 of the DFF 50, i.e., Q1=MD4. When the signal CK3 switches from logic 0 to logic 1, the left branch of the latch is turned off and the tail current is routed to the right branch of the latch, so that the previous state will be maintained even when the signal MD4 at the input 55 changes. The second latch 52 behaves in a similar way.

Figure 7A:
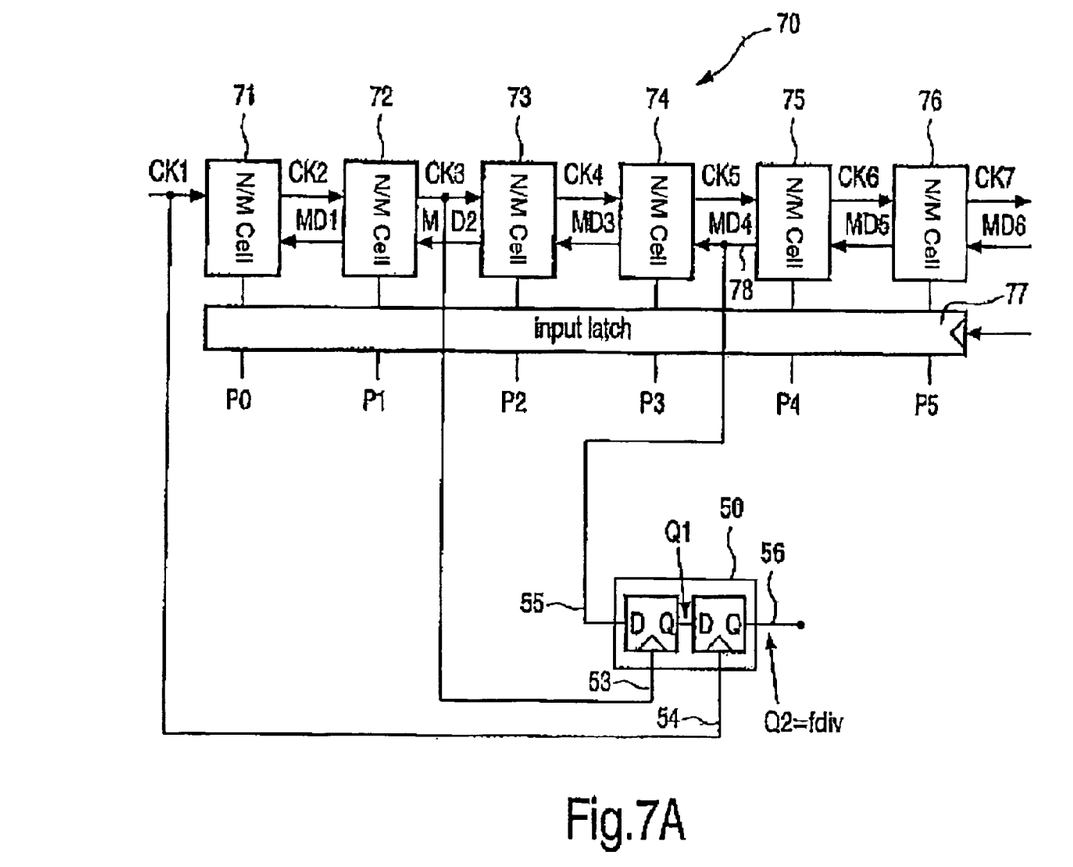
FIG. 7A is a schematic representation of a frequency divider, in accordance with the present invention.

A first application/implementation of a fractional-N divider 70 comprising the double-reclocking technique is illustrated in FIG. 7A. Designed for a CMOS Bluetooth transceiver operating at 2.5 GHz, the frequency divider 70 incorporates the double-reclocking, according to the present invention. The frequency divider 70 can replace the frequency divider 42 in FIG. 5, for example. The fractional-N divider 70 comprises a chain of six divide-by-N/M cells 71–76 and an input latch 77. In the present example, the output signal Q2 of the DFF 50 serves as output signal fdiv of the fractional-N divider 70.

Figure 7B:
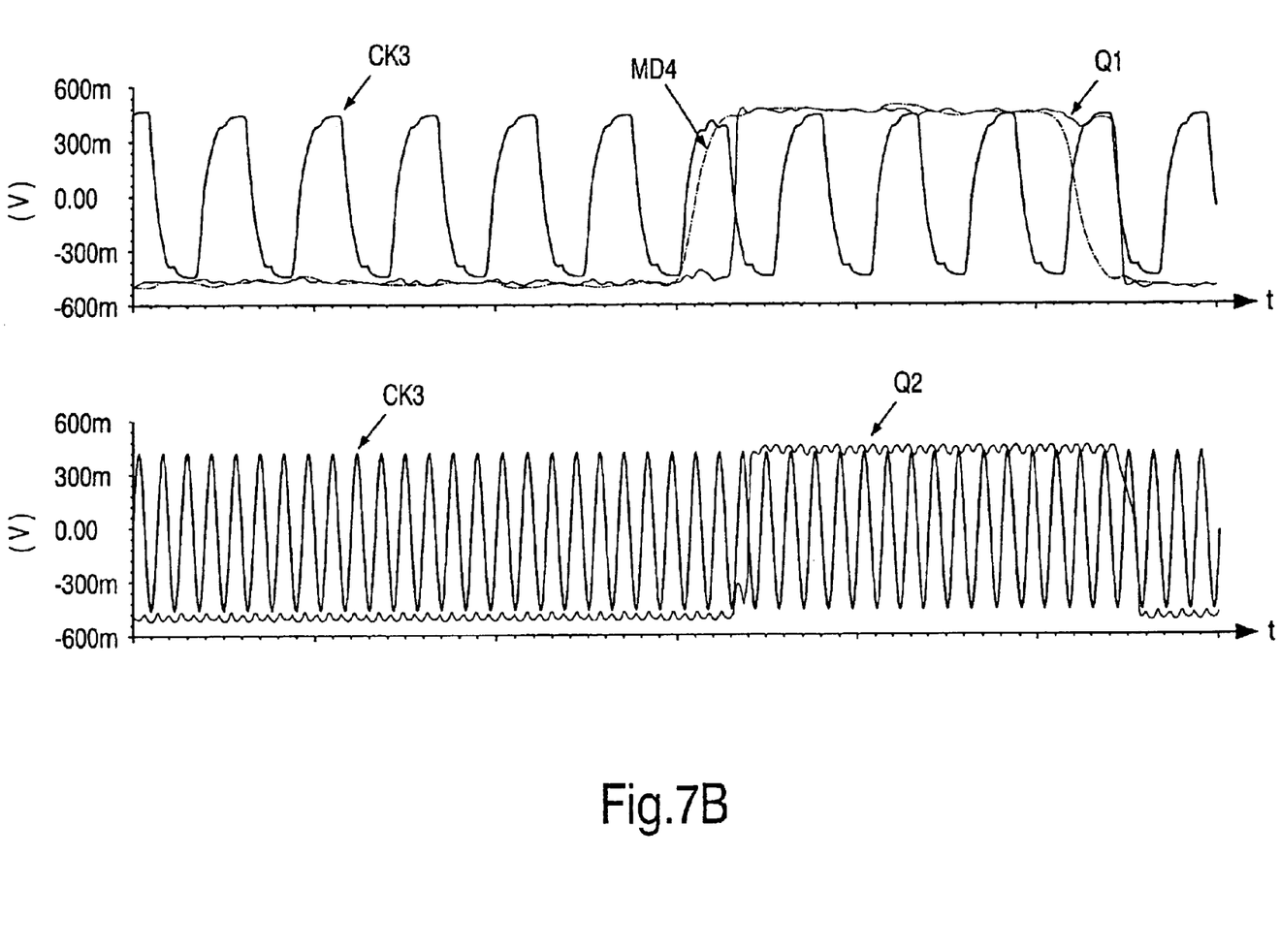
FIG. 7B is a diagram depicting the signals of the frequency divider of FIG. 7A.

FIG. 7B shows some simulated terminal signals (CK1, CK3, MD4, Q1, Q2, fdiv, and md4) of the frequency divider 70. The uppermost chart shows the signals (in m Volts) of the first latch 51 versus time (t). The chart at the bottom shows the signals (in m Volts) of the second latch 52 versus time (t).

The fractional-N divider 70 allows to generate an output signal fdiv whose frequency is lower than the frequency of an input signal CK1. The fractional-N divider 70 comprises, as illustrated in FIG. 7A, a chain of frequency dividing cells 71–76. Each of the frequency dividing cells 71–76 has five terminals Ckin, Ckout, Mdout, Mdin, and P, as illustrated in FIG. 1, for example.

The frequency dividing cells 71–76 have a pre-defined division ratio (MIN, such as $2/3$ where M=2 and N=3). One of the five terminals serves as a clock input for receiving an input clock (CKin); one terminal is a divided clock output for providing an output clock (CKout) to a subsequent frequency dividing cell, one terminal is a mode control input for receiving a mode control input signal (MDin) from the subsequent frequency dividing cell, and another one of the terminals is a mode control output for providing a mode control output signal (MDout) to a preceding frequency dividing cell. The terminal P allows the division ration N/M of the respective cell to be altered. A latch 77 is provided for altering the division ratio of each frequency dividing cell 71–76. A D-Flip-Flop 50 circuitry is provided. It comprises two latches 51, 52. The first latch 51 is clocked by a first signal CK3 and the second latch 52 is clocked by a second signal CK1. Both clock signals are tapped from terminals within the frequency dividing chain 71–76. In the example depicted in FIG. 7A, the first signal is tapped between cell 72 and cell 73 and the second signal CK1 is tapped at the input side of cell 71. The frequency of the first signal CK3 is lower than the frequency of the second signal CK1, i.e., fCK3<fCK1 (cf. FIG. 2B, foe example). In the present example, the signal MD4 tapped between the cell 74 and the cell 75 is applied to the input 55 of the DFF 50. Note that the timing relationship between the signals MD4 and CK3, and the timing relationship between the signals CK3 and CK1 are controllable, since both two signals pairs (MD4, CK3 and CK3, CK1) are tapped at terminals within the chain of frequency dividing cells 71–76, that are no more than 4 cells apart. Preferably, the terminals at which the signals of a signal pair are tapped should not be more than 2 cells apart (cf. FIG. 7A or FIG. 8, for example).

Figure 8:
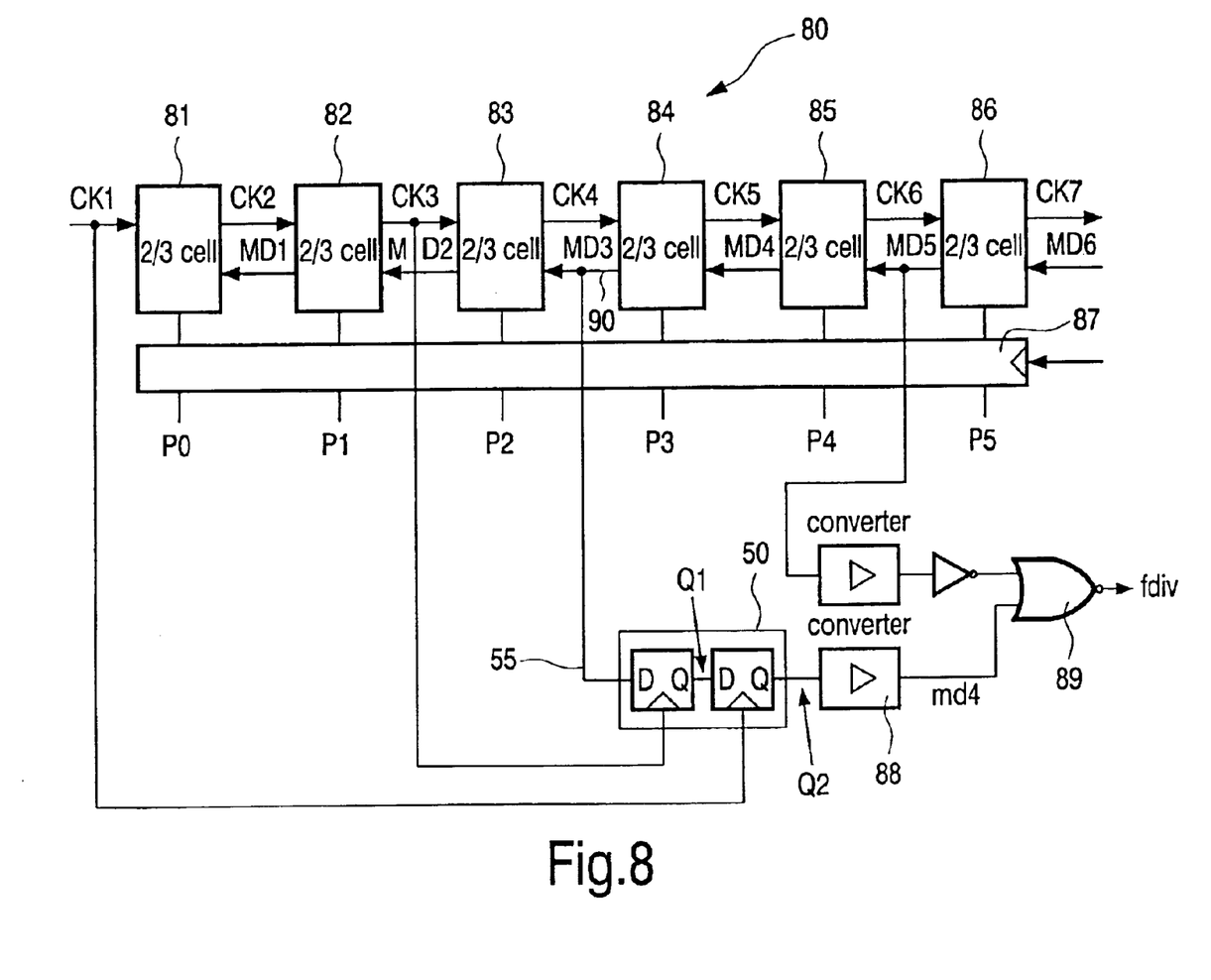
FIG. 8 is a schematic representation of another frequency divider, in accordance with the present invention

When using the double-reclocking, according to the present invention in connection with other circuitry where conventional full-swing DFFs are employed, for proper operation the low-swing and differential CML signals have to been converted to full-swing ones. Certain phase-frequency detectors (e.g., the PFD 48 in FIG. 5) may be built with conventional full-swing DFFs. The conversion to full-swing signals may be done by the converter 88 as shown in FIG. 8. According to the embodiment illustrated in FIG. 8, an output circuitry 88, 89 is provided for processing an output signal Q2 of the DFF 50 in order to generate another output signal fdiv. The signal fdiv might be fed to PFD 48, as shown in FIG. 5, for example.

The frequency dividing cells 81–86 have a pre-defined division ratio ($2/3$). A latch 87 is provided for altering the division ratio of each frequency dividing cell 81–86. A D-Flip-Flop 50 circuitry is employed. It comprises two latches 51, 52. The first latch 51 is clocked by a first signal CK3 and the second latch 52 is clocked by a second signal CK1. Both clock signals are tapped from terminals within the frequency dividing chain 81–86. In the example depicted in FIG. 8, the first signal CK3 is tapped between cell 82 and cell 83 and the second signal CK1 is tapped at the input side of cell 81. The frequency of the first signal CK3 is higher than the frequency of the second signal CK1, i.e., fCK3>fCK1. In the present example, the signal MD3 tapped between the cell 83 and the cell 84 is applied to the input 55 of the DFF 50. Note that the timing relationship between the signals MD3 and CK3, and the timing relationship between the signals CK3 and CK1 are controllable, since both two signals pairs (MD3, CK3 and CK3, CK1) are tapped at terminals within the chain of frequency dividing cells 81–86, that are no more than 2 cells apart.

Note that after the double-reclocking, only the second latch 52, the converter 88, and the NOR gate 89 add jitters to the output signal fdiv. The last two terms are unavoidable and are already present even without any reclocking. However, jitters generated by these gates can be minimized by proper design, thus making the output signal fdiv almost jitter free.

According to the double-reclocking scheme presented herein, the critical timing relationship is greatly reduced, favorably, into two separate items. Namely the timing between MD4 and CK3 (or MD3 and CK3, cf. FIG. 8), and the timing between CK3 and CK1. Both timing relationships become easily controllable. Also the frequency difference now is 4 instead of 16 (provided that the cells 71–76 are ⅔-cells), making it possible to avoid reclocking to take place around the thresholds of the latches, thus preventing the catastrophic errors from happening.

The very reliable and robust operation of the double-reclocking presented herein has been demonstrated. Under certain circumstances, jitters are completely eliminated through the double-reclocking.

It is to be noted that a successful jitter reduction or even a jitter elimination through the present reclocking scheme is only possible if the jitters are small and within certain limits.

For the reclocking technique in existence, which is restricted to synchronous circuits, the limit is equal to the period of the clock signal. This means that the clocking frequency sets an upper limit to the allowed jitter. For the proposed double-reclocking, it has been observed that jitters even larger than the period of the clock, CK1, are completely eliminated.

Therefore, double-reclocking is not only a technique to reduce or eliminate jitters of asynchronous circuits like the zipper divider 70 of FIG. 7A or the zipper divider 80 of FIG. 8, but also jitters being too large for the existing reclocking technique to cope with. This salient feature is very desirable as it allows much broader application areas than the reclocking technique in existence so far.

The double-reclocking according to the present invention is a very effective and robust technique to reduce or eliminate the jitters in asynchronous circuits. Improvements of a factor of 10 and more compared to conventional reclocking can easily be achieved when employing the double-reclocking presented herein. Depending on the implementation, improvement factors of more than 1000 are possible.

It must be pointed out that the proposed architecture can be applied to frequency divider with any number of cells without exception.

The present invention is suited for use in communication systems and other system where there exists a need to generate an accurate frequency signal fdiv. The present invention is suited for use in transmitters and receivers. The invention is particularly well suited for use in one-chip CMOS transceivers. Systems in accordance with the present invention can be employed in cellular phones (GSM or UMTS, for example), DECT hand sets, personal communication systems, Bluetooth devices, just to mention a few examples.

A frequency divider in accordance with the present invention can be combined with other circuits in order to realize power efficient implementations of transceivers, radio frequency (RF) integrated circuits (ICs), GSM solutions, DECT devices, PCS, and Bluetooth solutions.

It is appreciated that various features of the invention which are, for clarity, described in the context of separate embodiments may also be provided in combination in a single embodiment. Conversely, various features of the invention which are, for brevity, described in the context of a single embodiment may also be provided separately or in any suitable subcombination.

In the drawings and specification there has been set forth preferred embodiments of the invention and, although specific terms are used, the description thus given uses terminology in a generic and descriptive sense only and not for purposes of limitation.

What is claimed is:

1. Apparatus for generating an output signal whose frequency is lower than the frequency of an input signal, the apparatus comprising:
    a chain of frequency dividing cells, wherein each of the frequency dividing cells has a pre-defined division ratio and comprises
        a clock input for receiving an input clock;
        a divided clock output for providing an output clock to a subsequent frequency dividing cell;
        a mode control input for receiving a mode control input signal from the subsequent frequency dividing cell; and
        a mode control output for providing a mode control output signal to a preceding frequency dividing cell;
        a latch for altering the division ratio of each the frequency dividing cells,
        a D-Flip-Flop circuitry with two latches, the first latch being clocked by a first signal output from the subsequent frequency dividing cell and the second latch being clocked by a second signal input to the preceding frequency dividing cell,
        whereby the frequency of the first signal is lower than the frequency of the second signal.

2. The apparatus of claim 1, wherein the second signal is a signal tapped from the input signal.

3. The apparatus of claim 1, wherein the first signal is a signal tapped at one of the divided clock outputs within the chain of frequency dividing cells.

4. The apparatus of claim 1, wherein the D-Flip-Flop circuitry has an input being connected to one of the mode control inputs within the chain of frequency dividing cells.

5. The apparatus of claim 1, comprising an output circuitry for processing the output signal provided at an output of the second latch in order to provide another output signal.

6. The apparatus of claim 1, wherein
    the input signal to be divided is applicable to the clock input of one frequency dividing cell (71; 81) of the chain of frequency dividing cells,
    the divided clock output of the one frequency dividing cell of the chain of frequency dividing cells is connected to the clock input of the subsequent frequency dividing cell of the chain of frequency dividing cells, the mode control input of the one frequency dividing cell of the chain of frequency dividing cells is connected to the mode control output of the subsequent frequency dividing cell of the chain of frequency dividing cells.

7. The apparatus of claim 1, wherein the frequency dividing cells are divide-by-⅔ cells, wherein the division ratio (N/M) is switchable between 2 and 3.

8. The apparatus of claim 1, comprising latches being realized in current-mode logic (CML), wherein the latches include at least one of the following:
   the latch for altering the division ratio of each the frequency dividing cells,
   the first latch and second latch of the D-Flip-Flop circuitry.

9. The apparatus of claim 1, wherein each frequency dividing cell of the chain of frequency dividing cells comprises a programming input for application of a binary code word allowing together with the mode control input signals the division ratio (N/M) of the frequency dividing cells to be switched.

10. The apparatus of claim 1, wherein the chain of frequency dividing cells is realized according to a zipper divider architecture.

11. A transmitter or receiver system in a CMOS system, comprising an apparatus according to claim 1.

* * * * *